| (12) | United States Patent | (10) Patent No.: | US 11,367,479 B2 |
|---|---|---|---|
| | Yang et al. | (45) Date of Patent: | Jun. 21, 2022 |

(54) SRAM STRUCTURE AND METHOD

(71) Applicant: Taiwan Semiconductor Manufacturing Co., Ltd., Hsin-Chu (TW)

(72) Inventors: Chih-Chuan Yang, Hsinchu (TW); Shih-Hao Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/942,278

(22) Filed: Jul. 29, 2020

(65) Prior Publication Data

US 2021/0098049 A1 Apr. 1, 2021

Related U.S. Application Data

(60) Provisional application No. 62/907,962, filed on Sep. 30, 2019.

(51) Int. Cl.

| *G11C 16/04* | (2006.01) |
|---|---|
| *G11C 11/412* | (2006.01) |
| *H01L 21/475* | (2006.01) |
| *H01L 27/11* | (2006.01) |
| *G11C 11/419* | (2006.01) |

(52) U.S. Cl.
CPC .......... *G11C 11/412* (2013.01); *G11C 11/419* (2013.01); *H01L 21/475* (2013.01); *H01L 27/1104* (2013.01)

(58) Field of Classification Search
CPC ..... G11C 11/412; G11C 11/419; H01L 21/475; H01L 27/1104
See application file for complete search history.

(56) References Cited

U.S. PATENT DOCUMENTS

| 6,274,912 B1 * | 8/2001 | Mukai ................. G11C 11/405 |
|---|---|---|
| | | 257/365 |
| 7,586,147 B2 | 9/2009 | Liaw |
| 8,619,456 B2 * | 12/2013 | Liu .......................... H01L 27/24 |
| | | 365/148 |
| 8,693,235 B2 | 4/2014 | Liaw |
| 8,908,421 B2 | 12/2014 | Liaw |
| 9,236,300 B2 | 1/2016 | Liaw |
| 9,607,685 B2 | 3/2017 | Liaw |
| 9,646,973 B2 | 5/2017 | Liaw |
| 9,672,903 B2 | 6/2017 | Liaw |
| 9,691,471 B2 | 6/2017 | Liaw |
| 10,804,272 B2 * | 10/2020 | Kimura ............... H01L 27/0688 |
| 2015/0102418 A1 | 4/2015 | Kim |

(Continued)

FOREIGN PATENT DOCUMENTS

TW 201906139 A 2/2019

*Primary Examiner* — Pho M Luu
(74) *Attorney, Agent, or Firm* — Haynes and Boone, LLP

(57) ABSTRACT

Semiconductor devices and methods are provided. A semiconductor device of the present disclosure includes a bias source, a memory cell array including a first region adjacent to the bias source and a second region away from the bias source, and a conductive line electrically coupled to the bias source, a first memory cell in the first region and a second memory cell in the second region. The first memory cell is characterized by a first alpha ratio and the second memory cell is characterized by a second alpha ratio smaller than the first alpha ratio.

20 Claims, 7 Drawing Sheets

(56) References Cited

U.S. PATENT DOCUMENTS

2016/0276225 A1 9/2016 Kim et al.
2017/0076782 A1 3/2017 Liaw
2017/0179135 A1 6/2017 Pao et al.

* cited by examiner

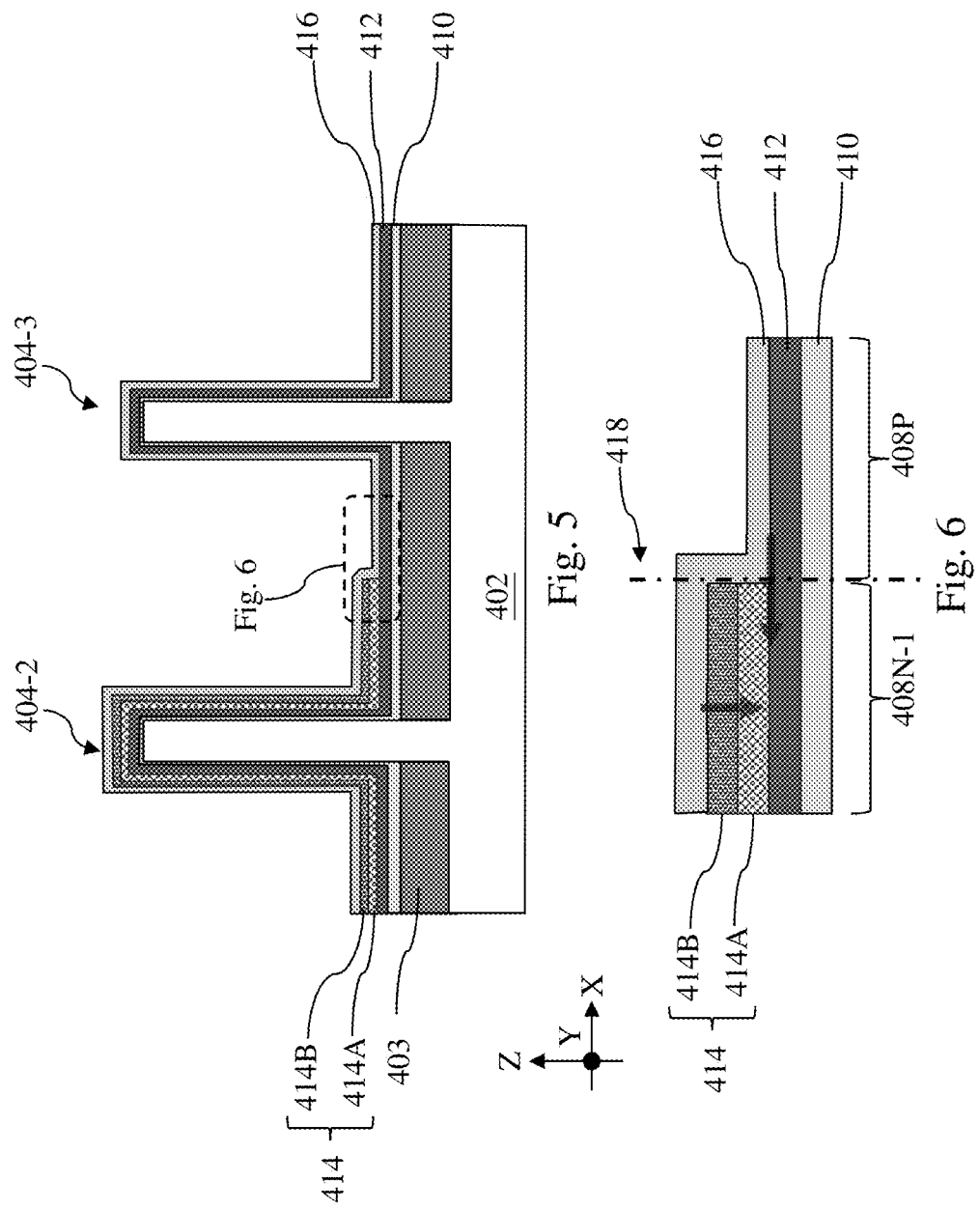

SRAM STRUCTURE AND METHOD

PRIORITY DATA

This application claims priority to U.S. Provisional Patent Application Ser. No. 62/907,962 filed on Sep. 30, 2019, the entire disclosure of which is hereby incorporated herein by reference.

BACKGROUND

Static random access memory ("SRAM") generally refers to any memory or storage that can retain stored data only when power is applied. As integrated circuit (IC) technologies progress towards smaller technology nodes, SRAMs may incorporate multi-gate structures, such as fin-like field effect transistors (FinFETs) or gate-all-around (GAA) transistors, into SRAM cells to enhance performance, where each SRAM cell can store a bit of data. SRAM cells are arranged into densely packed SRAM arrays that are controlled via bit lines and word lines. As the bit line dimensions shrink, the voltage drop (also known as ohmic drop or IR drop) due to bit line resistance may lower the supply voltage to distant SRAM cells to a level below the threshold voltage to operate these distant SRAM cells, resulting in inoperative SRAM cells or failed bits. Accordingly, although existing SRAM arrays have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 5 illustrates a schematic cross-sectional view of an area of the first SRAM cell in FIG. 4 along section I-I', according to aspects of the present disclosure.

FIG. 6 illustrates a schematic enlarged view of the area of the cross-sectional view in FIG. 5, according to aspects of the present disclosure.

DETAILED DESCRIPTION

Figure 1:
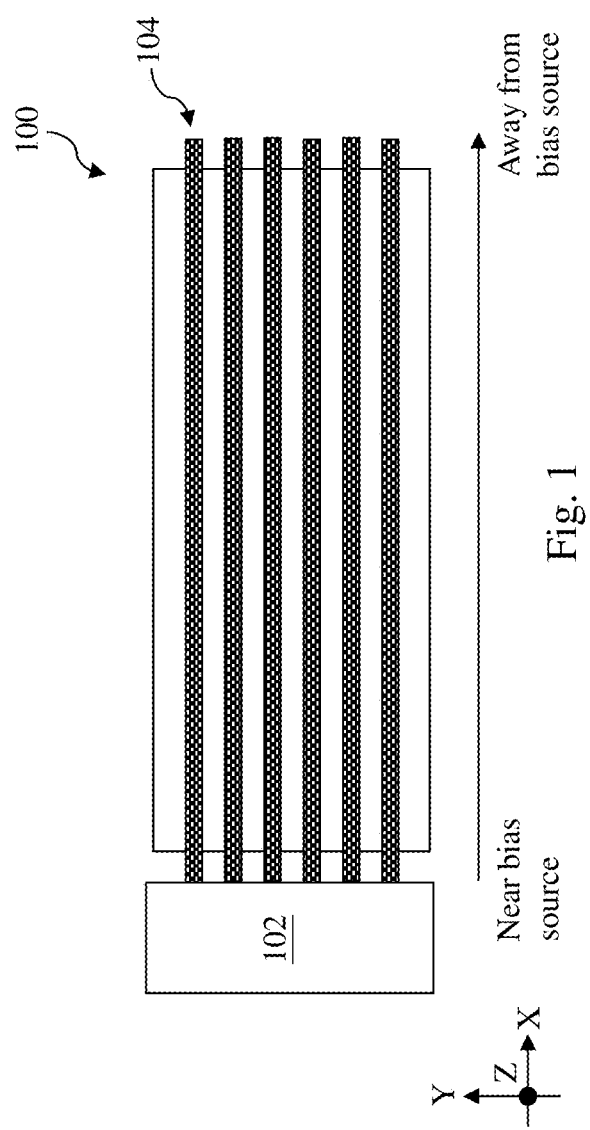
FIG. 1 illustrates a schematic top view of a first SRAM array driven by a bias source disposed on one side of the first SRAM array, according to aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

For advanced IC technology nodes, multi-gate transistors, such as fin-like field effect transistors (FinFETs) or gate-all-around (GAA) transistors, have become popular and promising candidates for high performance and low leakage applications. Memory arrays, such as static random access memory (SRAM) arrays, may incorporate FinFETs or GAA transistors into memory cells to enhance performance or packing density, where each memory cell can store a bit of data. As the dimensions of cells in an SRAM array shrink, bit lines that provide a supply voltage (Vcc) to cells in the SRAM array also shrink in dimensions. Resistance in the smaller bit lines increases, resulting in voltage drop (also known as ohmic drop or IR drop) along a length of a bit line. When a bias source is placed on one side of an SRAM cell, a bit line from the bias source may supply a bias voltage to cells adjacent to the bias source and a reduced bias voltage to cells away from the bias source as a result of the voltage drop.

Figure 2:
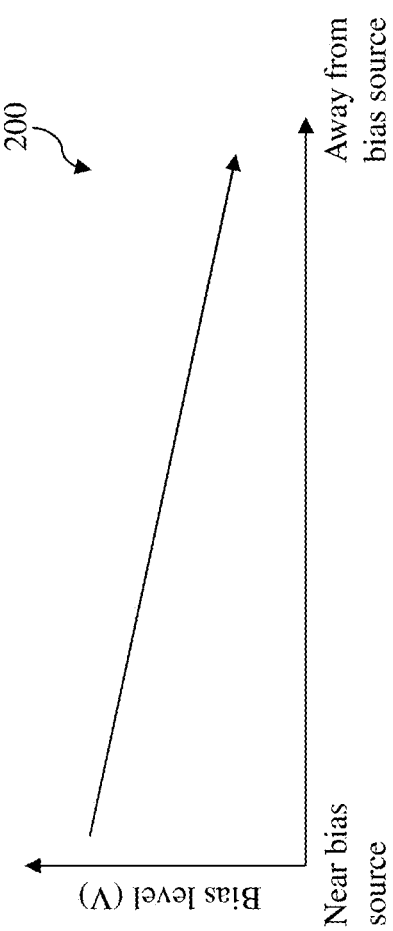
FIG. 2 illustrates a schematic diagram of bias levels from near the bias source to away from the bias source in the first SRAM, according to aspects of the present disclosure.

Referring to FIG. 1, illustrated therein is a schematic top view of a first SRAM array 100 driven by a bias source 102 disposed on one side of the first SRAM array 100. The first SRAM array 100 includes a plurality of SRAM cells that are driven by a plurality of bit lines, such as the bit line 104 shown in FIG. 1. Each of the plurality of bit lines, including the bit line 104, are electrically coupled to the bias source 102 to bias the plurality of SRAM cells with a supply voltage (Vcc). Each of the plurality of bit lines extends from the bias source 102 to SRAM cells near the bias source 102 and continues on to SRAM cells away from the bias source 102. As explained above, the increased resistance in the plurality of bit lines may result in a voltage drop along the lengths of the bit lines. SRAM cells away from the bias source 102 may be biased at a level lower than that for the SRAM cells near the bias source 102. Reference is now made to FIG. 2. FIG. 2 is a schematic diagram 200 of bias levels from near the bias source 102 to away from the bias source 102 in the first SRAM array 100. As shown in FIG. 2, with respect to the bit line 104, the bias level decreases along the distance from near the bias source 102 to away from the bias source 102.

Figure 3:
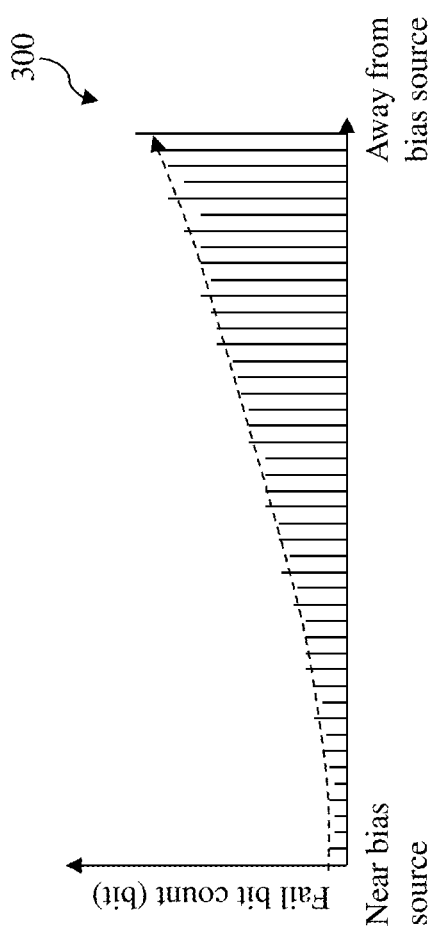
FIG. 3 illustrates a schematic diagram of the number of fail bits in the first SRAM array in relation to distance from the bias source, according to aspects of the present disclosure.

The voltage drop schematically shown in FIG. 2 may lower the bias voltage supplied to SRAM cells away from the bias source 102 and cause inoperative cells or fail memory bits. Referring now to FIG. 3, illustrated therein is a schematic diagram 300 of the number of fail bits in the first SRAM array 100 in relation to distance from the bias source 102. As shown in FIG. 3, it has been observed that as the voltage drop in the bit line 104 increases with the distance from the bias source 102, the fail bit count also increases. In SRAM design, fabrication, and performance, the minimum supply voltage (Vccmin) is the lowest voltage to keep an SRAM array operational and an important characteristic of an SRAM array. With respect to the first SRAM array 100 that suffers from voltage drop along the plurality of bits line, it may be necessary to increase the Vccmin as the reduced supply voltage may not be greater than the threshold voltages of transistors in SRAM cells to operate the same. Even if the bias voltage (supply voltage) may be increased to reduce fail bit count, it still may result in increased Vccmin and uneven bias distribution applied across SRAM cells having substantially the same threshold voltage.

To address the aforementioned phenomenon associated with voltage drop due to reduced bit line dimensions, the present disclosure provides an SRAM array with more than one region and SRAM cells in different regions have different threshold voltages and alpha ratios to accommodate the reduced bias level away from the bias source. The different threshold voltages and alpha ratios are achieved by means of moving work function layer boundaries of a p-type transistor (such as a p-type pull-up (PU) transistor) and an adjacent n-type transistor (such as an n-type pull-down (PD) transistor) as well as by enlarging or reducing a width of a metal gate cut trench separating a p-type transistor (such as a p-type pull-up (PU) transistor) and an adjacent n-type transistor (such as an n-type pass-gate (PG) transistor). The multi-region SRAM array of the present disclosure may be implemented without additional cost as fabrication of the proposed multi-region SRAM array of the present disclosure may not require additional mask or photolithography steps. By taking into consideration of the voltage drop along the lengths of bit line and implementing SRAM cells with different threshold voltages and alpha ratios to adapt to different bias level, the multi-region SRAM array of the present disclosures provides benefits of reduced fail bit counts and increased yield.

For avoidance of any doubts, the present disclosure is directed to multi-region SRAM arrays where SRAM cells in different regions have different threshold voltages, different alpha ratios, or both. The multi-region SRAM arrays of the present disclosure may be fabricated with or without additional photolithography masks and process. While embodiments that require no additional photolithography masks are described in more detail below in conjunction with FIGS. 4-11, embodiments of the present disclosure may be implemented with additional masks. For example, additional mask may be used to deposit different work function layers in different SRAM array regions, deposit different high-k gate dielectric materials in different SRAM array regions, selectively remove work functional layers or high-k gate dielectric materials in different SRAM array regions, form different shapes of channel members or semiconductor bodies in different SRAM array regions, vary interfacial layer thicknesses or high-k gate dielectric material thicknesses in different SRAM array regions, selectively apply plasma treatments to different SRAM array regions, or selectively implant dopants in different SRAM array regions.

Figure 4:
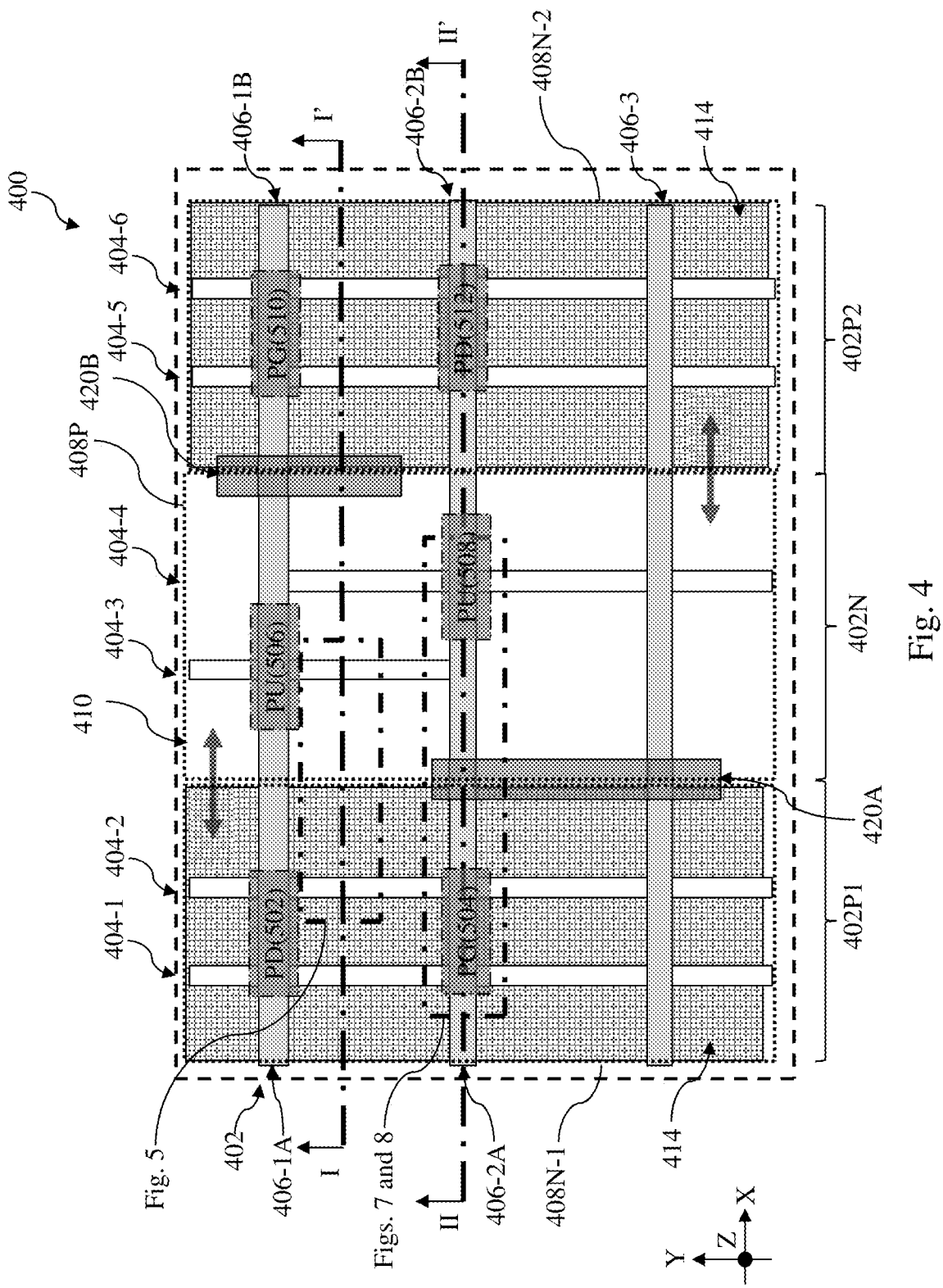
FIG. 4 illustrates a schematic top view of a first SRAM cell, according to aspects of the present disclosure.

Reference is first made to FIG. 4, which is a schematic top view of a first SRAM cell 400. An SRAM cell, such as the first SRAM cell 400, is a type of volatile semiconductor memory device that uses bi-stable latching circuitry to store a bit. As illustrated in FIG. 4, each bit in the first SRAM cell 400 is stored on four transistors (first pull-up transistor 506 (PU-1), second pull-up transistor 508 (PU-2), first pull-down transistor 502 (PD-1), and second pull-down transistor 512 (PD-2)) that form two cross-coupled inverters. This memory cell has two stable states which are used to denote 0 and 1. Two additional access transistors (first pass-gate transistor 504 (PG-1) and second pass-gate transistor 510 (PG-2)) serve to control the access to a storage cell during read and write operations. The first SRAM cell 400 includes six-transistors (6T) and may be referred to as a 6T SRAM cell or a single-port SRAM cell. It is noted, even though the embodiments of the present disclosure are described in conjunction with 6T SRAM cells, the present disclosure is not so limited. The present disclosure may be applicable to SRAM cells including more transistors, such as 7T, 8T, 9T, or 10T, that may be single-port, dual-port, or multi-port.

In the first SRAM cell 400, each of the pass-gate transistors, pull-up transistors and pull-down transistors may be a multi-gate transistor, such as a FinFET or a GAA transistor. The gates of the first and second pass-gate transistors 504 and 510 are electrically coupled to word-line (WL, not shown) that determines whether the first SRAM cell 400 is selected or not. In the first SRAM cell 400, a memory bit (e.g., a latch or a flip-flop) is formed of the first and second pull-up transistors 506 and 508 and the first and second pull-down transistors 502 and 512 to store a bit of data. The complementary values of the bit are stored in two ends of the cross-coupled or latched-up inverters. The stored bit can be written into, or read from, the first SRAM cell 400 through a bit line electrically coupled to source/drain of the first pass-gate transistor 504 (PG-1) and a bit-line bar electrically coupled to source/drain of the second pass-gate transistor 510 (PG-2). In this arrangement, the bit line and bit line bar may carry complementary bit-line signals. The cross-coupled inverters of the first SRAM cell 400 is biased between a positive power supply voltage Vdd and a ground potential Vss. The two ends of the cross-coupled inverters of the first SRAM cell 400 can hold the data so that the stored data will not be lost without applying a refresh cycle as long as power is supplied through Vdd.

In operation, if the first and second pass-gate transistors 504 (PG-1) and 510 (PG-2) are inactive, the first SRAM cell 400 will maintain the complementary values at the storage nodes indefinitely as long as the cross-coupled inverters are biased by the positive power supply voltage Vdd. This is so because each inverter of the pair of cross coupled inverters drives the input of the other, thereby maintaining the voltages at the storage nodes. This situation will remain stable until the positive power supply voltage Vdd is removed from the first SRAM cell 400, or, a write cycle is performed changing the stored data at the storage nodes.

During a WRITE operation, bit line and bit line bar are set to opposite logic values according to the new data that will be written into the first SRAM cell 400. For example, in an SRAM write operation, a logic state "1" stored in a data latch of the first SRAM cell 400 can be reset by setting bit line to "0" and bit line bar to "1". In response to a binary code from a row decoder (not shown), a word line coupled to the first and second pass-gate transistors 504 (PG-1) and 510 (PG-2) of the first SRAM cell 400 is asserted to select the memory cell and turn on the first and second pass-gate transistors 504 (PG-1) and 510 (PG-2). As a result, the storage nodes are connected to bit line and bit line bar respectively. Furthermore, a first storage node of the data latch (one of the cross-coupled inverters) is discharged by bit line to "0" and a second storage node of the data latch (the other of the cross-coupled inverters) is charged by bit line bar to "1". As a result, the new data logic "0" is latched into the first SRAM cell 400.

In a READ operation, both bit line and bit line bar of the first SRAM cell 400 are pre-charged to a voltage approximately equal to the operating voltage of the memory bank in which the first SRAM cell 400 is located. In response to a binary code from the row decoder, a word line coupled to the first pass-gate transistor 504 (PG-1) and the second pass-gate transistor 510 (PG-2) of the first SRAM cell 400 is asserted so that the data latch is selected to proceed to a READ operation. During a READ operation, through a turned on first and second pass-gate transistors 504 (PG-1) and 510 (PG-2), one bit line (i.e., one of bit line and bit line bar) coupled to the storage node storing a logic "0" is discharged to a lower voltage. Meanwhile, the other bit line (i.e., one of bit line and bit line bar) remains the pre-charged voltage because there is no discharging path between the other bit line and the storage node storing a logic "1". The differential voltage between bit line (BL) and bit line bar (BLB) is detected by a sense amplifier (not shown). Furthermore, the sense amplifier amplifies the differential voltage and reports the logic state of the memory cell via a data buffer.

Based on the foregoing descriptions, it can be seen how a voltage drop may impact the WRITE operation of the first SRAM cell 400. When the bit line supplies a lower bias voltage due to resistance of the bit line of reduced dimensions, the bit line may not successfully charge a storage node to a logic "1", resulting in a fail bit. For example, when bit cell voltage does not reach the desired voltage level during the WRITE operation as a result of the voltage drop, the WRITE operation would fail. Similarly, when the bit line supplies a lower bias voltage due to resistance of the bit line bar of reduced dimensions, the bit line bar may not successfully discharge a storage node to a logic "0", also resulting in a fail bit.

As described above, the present disclosure provides embodiments of multi-region SRAM arrays where SRAM cells in a region away from to a bias source have a lower alpha ratio than SRAM cells in another region closer to a bias source. There are several ways to realize such multi-region SRAM arrays. Reference is still made to FIG. 4. In some embodiments, the first SRAM cell 400 is fabricated over a first P-well 402P1, a second P-well 402P2, and an N-well 402N sandwiched between the first P-well 402P1 and the second P-well 402P2 on a semiconductor substrate 402. The semiconductor substrate 402 may consist essentially of silicon. In some embodiments, the semiconductor substrate 402 may include another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as SiGe, SiPC, GaAsP, AlInAs, AlGaAs, GaInAs, GaInP, and/or GaInAsP; or combinations thereof. Alternatively, the semiconductor substrate 402 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, the semiconductor substrate 402 may include one or more group III-V materials. In some instances, the N-well 402N may be doped with n-type dopants, such as phosphorus, arsenic, other n-type dopant, or combinations thereof. Similarly, each of the first and second P-wells 402P1 and 402P2 may be doped p-type dopants, such as boron (for example, $BF_2$), indium, other p-type dopant, or combinations thereof.

The first SRAM cell 400 may include a first n-type device area 408N-1 over the first P-well 402P1, a p-type device area 408P over the N-well 402N, and a second n-type device area 408N-2. In some embodiments, the first pull-down transistor 502 (PD-1) and the first pass-gate transistor 504 (PG-1) are n-type transistors disposed in the first n-type device area 408N-1; the first pull-up transistor 506 (PU-1) and the second pull-up transistor 508 (PU-2) are p-type transistors disposed in the p-type device area 408P; and the second pull-down transistor 512 (PD-2) and the second pass-gate transistor 510 (PG-2) are n-type transistors disposed in the second n-type device area 408N-2. In some embodiments, each of the first pull-down transistor 502 and the first pass-gate transistor 504 are double-active-region devices formed over two fins (when the transistors are FinFETs) or fin-shape active regions (when the transistors are GAA transistors having channel members stacked vertically in fin-shape active regions) 404-1 and 404-2. Similarly, each of the second pull-down transistor 512 and the second pass-gate transistor 510 are double-active-region devices formed over two fins (when the transistors are FinFETs) or fin-shape active regions (when the transistors are GAA transistors having channel members stacked vertically in fin-shape active regions) 404-5 and 404-6. In these embodiments, unlike the pull-down and pass-gate transistors, the first pull-up transistor 506 and the second pull-up transistor 508 are single-active-region devices formed over a fin/fin active region 404-3 and a fin/fin active region 404-4, respectively.

In some embodiments, a first metal gate stack 406-1, a second metal gate stack 406-2, and a third metal gate stack 406-3 may be formed over the fin/fins active regions 404-1, 404-2, 404-3, 404-4, 404-5, and 404-6. In some implementations, a metal gate cut process may be adopted to form first metal gate cut feature 420A and second metal gate cut feature 420B. As shown in FIG. 4, the first metal gate stack 406-1 may be divided by the second metal gate cut feature 420B into a first metal gate stack segment 406-1A, a second metal gate stack segment 406-1B. Similarly, the second metal gate stack 406-2 may be divided by the first metal gate cut feature 420A into a third metal gate stack segment 406-2A and a fourth metal gate stack segment 406-2B. Each of the first metal gate cut feature 420A and the second metal gate cut feature 420B includes one or more dielectric material filled into a metal gate cut trench that completely severs the respective metal gate stack (406-1 or 406-2).

In some embodiments, the multi-region SRAM array may be implemented by moving a boundary between work function layers over an n-type transistor and a p-type transistor in an SRAM. To be more precise, the multi-region SRAM array may be implemented by moving a boundary between work function layers for an n-type transistor and work function layers for a p-type transistor. To illustrate these embodiments, a schematic Y-direction cross-sectional view of an area of the first SRAM cell in FIG. 4 along section I-I' is provided in FIG. 5. Depicted in FIG. 5 are fin 404-2 of the n-type first pull-down transistor 502 and fin 404-3 of the p-type first pull-up transistor 506. An isolation structure 403 may be formed between fin 404-2 and fin 404-3. Please note, although the transistors in FIG. 5 are shown to be FinFETs with fins, the present disclosure is not so limited. Embodiments of the present disclosure may be applied to SRAM cells implemented with GAA transistors, in which case active region 404-2 and 404-3 are fin-shape active regions with vertically stacked channel members. In the embodiments represented in FIG. 5, the fins 404-2 and 404-3 are formed over the semiconductor substrate 402 using any suitable process. In some implementations, a combination of deposition, lithography and/or etching processes are performed to define fins 404-2 and 404-3 extending from the semiconductor substrate 402. For example, forming fins 404-2 and 404-3 includes performing a lithography process to form a patterned resist layer over semiconductor substrate 402 (or a material layer, such as a heterostructure, disposed over semiconductor substrate 402) and performing an etching process to transfer a pattern defined in the patterned resist layer to semiconductor substrate 402 (or the material layer, such as the heterostructure, disposed over semiconductor substrate 402). The lithography process can include forming a resist layer on semiconductor substrate 402 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of semiconductor substrate 402 (or a material layer disposed over semiconductor substrate 402). The etching process can include a dry etching process (for example, a reactive ion etching (RIE) process), a wet etching process, other suitable etching process, or combinations thereof. After the etching process, the patterned resist layer is removed from semiconductor substrate 402, for example, by a resist stripping process. Alternatively, fins 404-2 and 404-3 are formed by a multiple patterning process, such as a double patterning lithography (DPL) process (for example, a lithography-etch-lithography-etch (LELE) process, a self-aligned double patterning (SADP) process, a spacer-is-dielectric patterning (SIDP) process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Generally, double patterning processes and/or multiple patterning processes combine lithography processes and self-aligned processes, allowing patterns to be created that have, for example, pitches smaller than what is otherwise obtainable using a single, direct lithography process. For example, in some implementations, a patterned sacrificial layer is formed over a substrate using a lithography process, and spacers are formed alongside the patterned sacrificial layer using a self-aligned process. Then, the patterned sacrificial layer is removed, and the spacer layers can be used to pattern the semiconductor substrate 402 to form fins, such as fins 404-2 and 404-3. In some implementations, the exposure process can implement maskless lithography, electron-beam writing, ion-beam writing and/or nanoprint technology. In some embodiments, fins 404-1, 404-2, 404-5, and 404-6 over the first n-type device area 408N-1 and the second n-type device area 408N-2 are formed of silicon; and fins 404-3 and 404-4 over the p-type device area 408P are formed of silicon germanium for improved hole mobility.

Over the fins 404-1, 404-2, 404-3, and 404-4 lies the first metal gate stack segment 406-1A. In some embodiments represented in FIGS. 4 and 5, the first metal gate stack segment 406-1A includes an interfacial layer 410 deposited over the semiconductor substrate 402 and the fins 404-2 and 404-3. The interfacial layer 410 may be formed of silicon oxide. In some embodiments, the first metal gate stack segment 406-1A may also include one or more high-k dielectric layers 412 deposited over the interfacial layer 410. The one or more high-k dielectric layers 412 may include hafnium, zirconium, aluminum, lanthanum, tantalum, titanium, yttrium, oxygen, nitrogen, other suitable constituent, or combinations thereof. In some implementations, the one or more high-k dielectric layers include $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. High-k dielectric material generally refers to dielectric materials having a high dielectric constant, for example, greater than that of silicon oxide ($k \approx 3.9$).

In embodiments where fins 404-3 and 404-4 over the p-type device area 408P are formed of silicon germanium, the first metal gate stack segment 406-1A includes a first work function material layer 414 over the fin 404-2 and a second work function material layer 416 over the fin 404-3 and the first work function material layer 414. In some implementations, the first work function material layer 414 may include an aluminum-free material such as titanium nitride (TiN), tantalum nitride, molybdenum nitride (MoN), platinum (Pt), iridium (Jr), or a combination thereof. In one embodiment, the first work function material layer 414 includes titanium nitride. In some implementations, the second work function material layer 416 may include an aluminum-containing material, such as aluminum (Al), titanium aluminum (TiAl), titanium aluminum carbide (TiAlC), tantalum aluminum (TaAl), tantalum aluminum carbide (TaAlC), titanium aluminum nitride (TiAlN), aluminum nitride (AlN), hafnium aluminum carbide (HfAlC), or hafnium aluminum nitride (HfAlN). In one embodiment, the second work function material layer 416 includes titanium aluminum. In some embodiments, the first work function material layer 414 may be a multilayer, such as a double-layer. In some instances shown in FIG. 5, the first work function material layer 414 may include a lower work function material layer 414A and an upper work function material layer 414B over the lower work function material layer 414A. In some embodiments, the lower work function material layer 414A and the upper work function material layer 414B may be sequentially deposited using identical or different aluminum-free work function materials. Because the second work function material layer 416 is formed over both the first n-type device area 408N-1 (see FIG. 4) and the p-type device area 408P (see FIG. 4), the boundary between the first pull-down transistor 502 and the first pull-up transistor 506 is primarily defined by the first work function material layer 414 (shown by the shaded area in FIG. 4). To be precise, the boundary between the first pull-down transistor 502 and the first pull-up transistor 506 is a horizontal boundary of different type of work function material layers. It is noted that aluminum-containing work function material layers (such as the second work function material layer 416) are conventionally deposited near channel regions of n-type devices to lower threshold voltage of n-type device. In that sense, the second work function material layer 416 is conventionally considered n-type work function material. That is, in at least some embodiments of the present disclosure, the "conventionally n-type" second work function material layer 416 is not only deposited over p-type channel regions, but also directly on high-k dielectric layer over p-type channel regions. In some implementations, due to use of silicon germanium channel in the p-type device area 408P, transistors in the p-type device area 408P may have a threshold voltage much lower than that of transistors in n-type device areas 408N-1 and 408N-2. To increase the threshold voltage of transistors in the p-type device area 408P for balanced performance, the aluminum-containing second work function material layer 416 is placed near the channel regions of the p-type device area 408P.

The boundary between the first pull-down transistor 502 and the first pull-up transistor 506 in FIG. 5 is enlarged and illustrated in FIG. 6. As described above, the first work function material layer 414 is free of aluminum and second work function material layer 416 contains aluminum. It has been observed that aluminum in the second work function material layer 416 may diffuse along the interface between high-k dielectric layer 412 and the first work function material layer 414 to lower the threshold voltage of the first pull-down transistor 502. When a front edge 418 of the first work function material layer 414 is moved toward the first n-type device area 408N-1, the aluminum diffusion path along the interface into the first work function material layer 414 is shortened and more aluminum may diffuse from the second work function material layer 416 into the first work function material layer 414, resulting in a reduced threshold voltage of the first pull-down transistor 502 and an increased threshold voltage of the first pull-up transistor 506. Conversely, when the front edge 418 of the first work function material layer 414 is moved towards the p-type device area 408P, the aluminum diffusion path along the interface into the first work function material layer 414 is lengthened and less aluminum may diffuse into the first work function material layer 414, resulting in an increased threshold voltage of the first pull-down transistor 502 and a reduced threshold voltage of the first pull-up transistor 506. An alpha ratio (a ratio or pull up ratio) of an SRAM cell represent a write stability of the SRAM cell. In general, lowering write stability (a ratio) means increasing the writability the SRAM cell. With respect to the first SRAM cell 400, the alpha ratio may be calculated by the drive current of the first pull-up transistor 506 divided by the drive current of the first pass-gate transistor 504. When the threshold voltage of the first pull-up transistor 506 increases (due to moving the front edge 418 towards the first n-type device area 408N-1), its drive current lowers, resulting in a reduced alpha ratio. The reduced alpha ratio translates into easy writability.

A beta ratio ($\beta$ ratio or cell ratio) of an SRAM cell represent a read stability of the SRAM cell. With respect to the first SRAM cell 400, the beta ratio may be calculated by the drive current of the first pull-down transistor 502 divided by the drive current of the first pass-gate transistor 504. When a front edge 418 of the first work function material layer 414 is moved toward the first n-type device area 408N-1, the aluminum diffusion path along the interface into the first work function material layer 414 is shortened and more aluminum may diffuse from the second work function material layer 416 into the first work function material layer 414, resulting in a reduced threshold voltage of the first pull-down transistor 502. The reduced threshold voltage of the first pull-down transistor 502 translates into increased drive current for the first pull-down transistor 502 and therefore an increased beta ratio. Therefore, by moving the front edge 418 toward the first n-type device area 408N-1, to increase of the threshold voltage of the first pull-up transistor 506, the beta ratio may increase. Because an increased beta ratio may lead to a reduced alpha ratio, it is important to have a mechanism to keep the beta ratio in check. In this regard, the present disclosure also presents a mechanism to adjust or tune the beta ratio Foregoing alpha ratio and beta ratio analysis and adjustment mechanism also apply to the second pull-up transistor 508, the second pass-gate transistor 510, and the second pull-down transistor 512. Descriptions in this regard are not repeated for brevity.

Figure 7:
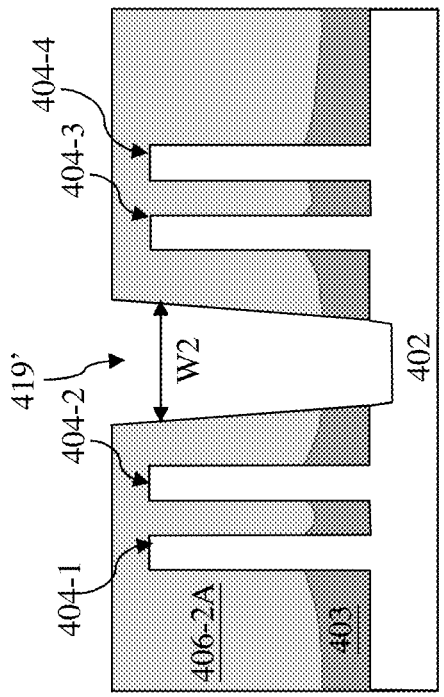
FIG. 7 illustrates a schematic cross-sectional view of a first gate trench having a first width W1 in an area of the first SRAM cell in FIG. 4 along section II-II', according to aspects of the present disclosure.
Figure 8:
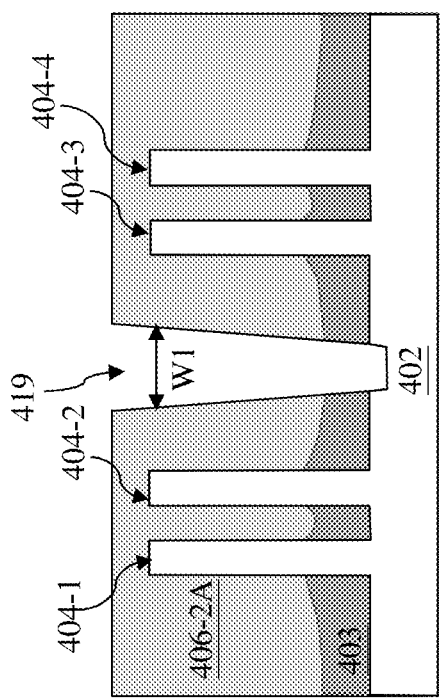
FIG. 8 illustrates a schematic cross-sectional view of a second gate trench having a second width W2 in an area of the first SRAM cell in FIG. 4 along section II-II', according to aspects of the present disclosure.

Reference is now made to FIGS. 7 and 8, which are schematic cross-sectional views of a metal gate cut trench along section II-II' in FIG. 4 for formation of the first metal gate cut feature 420A. As shown in FIGS. 7 and 8, the third metal gate stack segment 406-2A is deposited over and around fins 404-1, 404-2, 404-3, and 404-4 that rise above the isolation structure 403. In FIG. 7, a first metal gate cut trench 419 with a first width W1 is formed through the third metal gate stack segment 406-2A. In some implementations, the first metal gate cut trench 419 extends through the isolation structure 403 and into the substrate 402 so as to completely sever the third metal gate stack segment 406-2A. In FIG. 8, a second metal gate cut trench 419' with a second width W2 is formed through the third metal gate stack segment 406-2A. The first width W1 and the second width W2 may be measured at top surface levels of the fins 404-1, 404-2, 404-3, and 404-4. The second width W2 is greater than the first width W1. When oxygen-containing etchants are used, formation of the wider second metal gate cut trench 419' exposes the third metal gate stack segment 406-2A to more oxidation than formation of the first metal gate cut trench 419. As the third metal gate stack segment 406-2A includes the second work function material layer 416, formation of the second metal gate cut trench 419' causes more aluminum in the aluminum-containing second work function material layer 416 to oxidize than formation of the first metal gate cut trench 419. It has been observed that when more aluminum is allowed to be oxidized, the threshold voltage of the n-type first pass-gate transistor 504 is more likely to increase, resulting in a reduced drive current. When less aluminum in aluminum-containing second work function material layer 416 is oxidized due to the narrower first metal gate cut trench 419, the threshold voltage of the n-type first pass-gate transistor 504 is less likely to increase and its drive current is less likely to decrease. With respect to the first SRAM cell 400, the beta ratio may be calculated by the drive current of the first pull-down transistor 502 divided by the drive current of the first pass-gate transistor 504. As compared to the first metal gate cut trench 419, adoption of the wider second metal gate cut trench 419' would lead to a reduced drive current of the first pass-gate transistor 504, which in turn would lead to increase in the beta ratio and increase in the alpha ratio. Conversely, as compared to the second metal gate cut trench 419', adoption of the narrower first metal gate cut trench 419 would lead to an increased drive current of the first pass-gate transistor 504, which in turn would lead to reduction in the beta ratio and reduction in the alpha ratio. According to embodiments of the present disclosure, formation of metal gate cut trenches of different widths may be implemented to balance the beta ratio. In some embodiments, an SRAM array of the present disclosure may have substantially uniform SRAM cell beta ratios across the SRAM array and reduced alpha ratios in SRAM cells located away from the bias source to counteract the IR drop.

Foregoing beta ratio analysis and adjustment mechanism also apply to the metal gate cut trench for formation of the second metal gate cut feature 420B and the second pass-gate transistor 510. Descriptions in this regard are not repeated for brevity.

Figure 9:
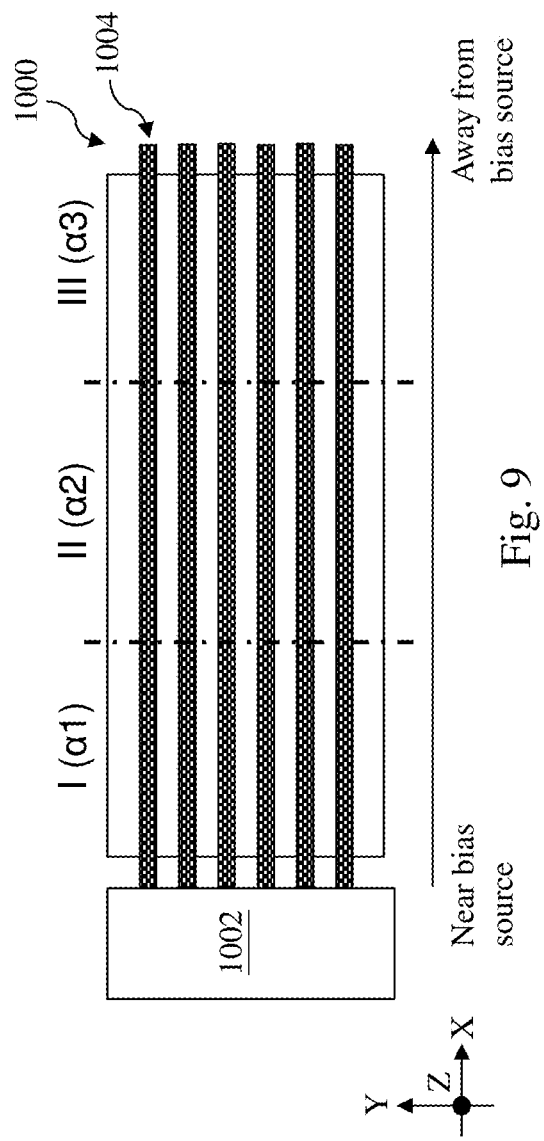
FIG. 9 illustrates a schematic top view of a second SRAM array divided into three zones and driven by a bias source disposed on one side of the second SRAM array, according to aspects of the present disclosure.
Figure 10:
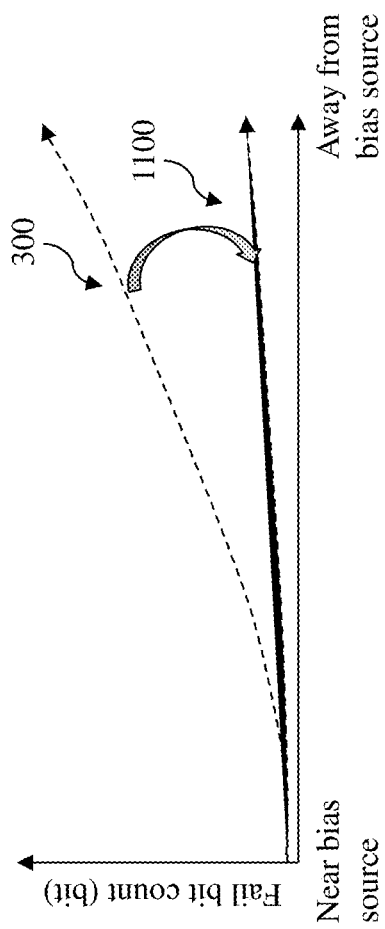
FIG. 10 illustrates a reduced fail bit counts due to implementation of the embodiments represented in FIG. 9, according to aspects of the present disclosure.

To remedy the increased fail bit count due to voltage drop along bit line (or bit line bar), the present disclosure provides embodiments of an SRAM array with more than one region and SRAM cells in different regions have different threshold voltages. Reference is now made to FIG. 9, which illustrates a multi-region SRAM array 1000. The multi-region SRAM array 1000 includes a bias source 1002 to supply bias voltage to SRAM cells in the multi-region SRAM array 1000 via a plurality of bit lines (or bit line bar) 1004. The multi-region SRAM array 1000 includes more than one regions. In the embodiments, the multi-region SRAM array 1000 includes three regions, each of which have different threshold voltages and alpha ratios. However, multi-region SRAM arrays with less or more regions are fully envisioned by the present disclosure. For example, in alternative embodiments, the multi-region SRAM array 1000 may include two, four or five regions.

In some embodiments represented in FIG. 9, the multi-region SRAM array 1000 includes region I, region II and region III. SRAM cells in region I have an alpha ratio greater than that of SRAM cells in region II. SRAM cells in region I are characterized by a first alpha ratio ($\alpha1$), SRAM cells in region II are characterized by a second alpha ratio ($\alpha2$), and SRAM cells in region III are characterized by a third alpha ration ($\alpha3$). In some implementations, to accommodate the voltage drop along the length of the bit lines 1004 away from the bias source 1002, the third alpha ratio ($\alpha3$) is smaller than the second alpha ratio ($\alpha2$) and the second alpha ratio ($\alpha2$) is smaller than the first alpha ratio ($\alpha1$). As described above, because the writability of SRAM cells increases with the lowering of the alpha ration, region III with the third alpha ratio ($\alpha3$) is easier to write than region II with the second alpha ratio ($\alpha2$). Similarly, region II with the second alpha ratio ($\alpha2$) is easier to write than region I with the first alpha ratio ($\alpha1$). The different alpha ratios may be realized by moving the boundary between the n-type first pull-down transistor 502 and the p-type first pull-up transistor 506 towards the n-type first pull-down transistor 502 by different amounts and by moving the boundary between the p-type second pull-up transistor 508 and the n-type second pull-down transistor 512 towards the n-type second pull-down transistor 512 by different amounts. When the boundary between the n-type transistor (such as the first pull-down transistor 502 and the second pull-down transistor 512) and the p-type transistor (such as the first pull-up transistor 506 and the second pull-up transistor 508) in region I is considered in a default position, the boundary between the n-type transistor (such as the first pull-down transistor 502 and the second pull-down transistor 512) and the p-type transistor (such as the first pull-up transistor 506 and the second pull-up transistor 508) in region II is moved more towards the n-type transistor. Similarly, compared to the boundary between the n-type transistor (such as the first pull-down transistor 502 and the second pull-down transistor 512) and the p-type transistor (such as the first pull-up transistor 506 and the second pull-up transistor 508) in region I, the boundary between the n-type transistor (such as the first pull-down transistor 502 and the second pull-down transistor 512) and the p-type transistor (such as the first pull-up transistor 506 and the second pull-up transistor 508) in region III is moved even more towards the n-type transistor. In some instances, if the boundary in region I is considered the default position, the boundary in region II is moved toward the n-type transistor by about 3 nm and the boundary in region III is moved toward the n-type transistor by about 9 nm. In terms of threshold voltage, the threshold voltage of the p-type pull-up transistors in region I is greater than the threshold voltage of the p-type pull-up transistors in region II, and the threshold voltage of the p-type pull-up transistors in region II is greater than the threshold voltage of the p-type pull-up transistors in region III.

To balance off increase in the beta ratios due to moving of the boundaries of work function layers, regions I, II and III include different metal gate cut feature widths. For example, metal gate cut features in SRAM cells in region I have a first width W1, metal gate cut features in SRAM cells in region II have a second width W2, and metal gate cut features in SRAM cells in region III have a third width W3. In some instances, W1 is greater than W2 and W2 is great than W3. As describe above, width reduction in the metal gate cut features may result in lowering of the beta ratio to counteract increases the beta ratio due to moving of the boundaries. In one embodiment, W1 is about 2 nm wider than W2 and is about 4 nm wider than W3.

Implementations of the multi-region SRAM arrays such as the multi-region SRAM array 1000 in FIG. 9 accommodate the voltage drop in bit lines by lowering the alpha ratio of SRAM cells in distant regions such that the lowered bias voltage may still successfully operate SRAM cells with lowered alpha ratios. As a result, an overall reduction of fail bit count shown in FIG. 10 may be observed. As compared to the fail bit count curve 300 shown in FIG. 3, the fail bit count curve 1100 of a multi-region SRAM array of the present disclosure is flat and does not rise as much with distance from the bias source 1002.

Figure 11:
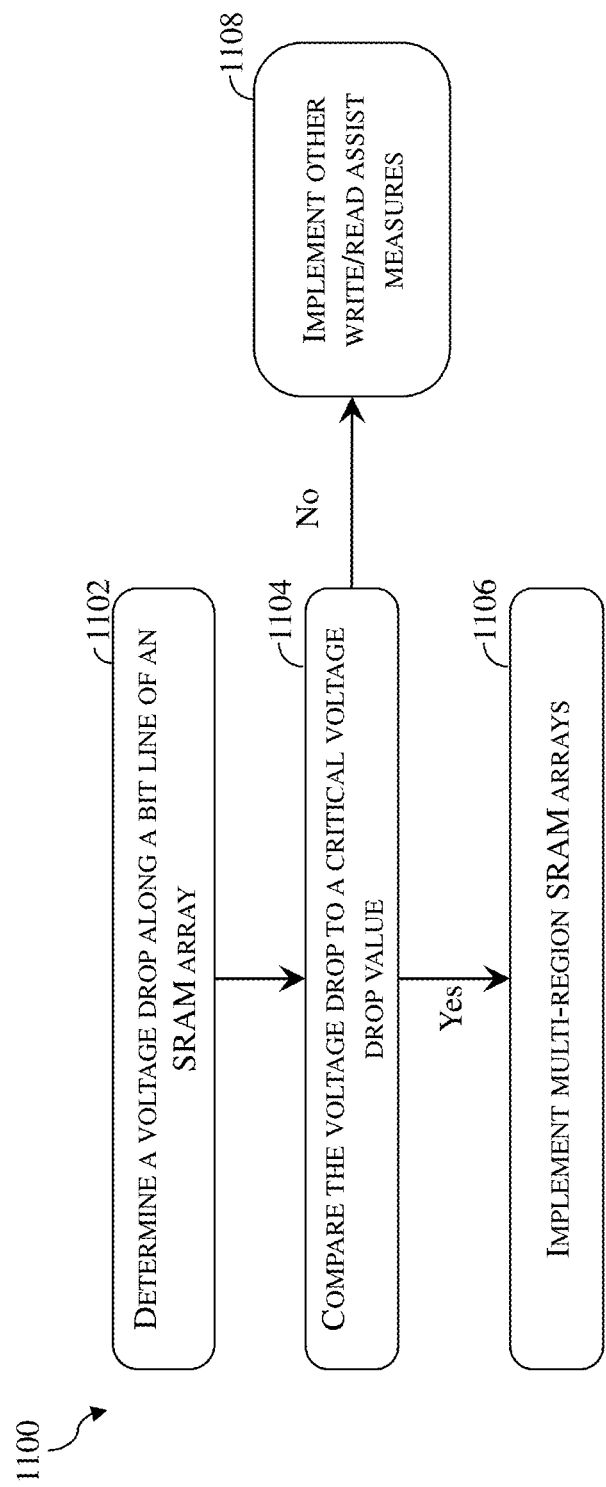
FIG. 11 illustrates a flowchart of a method according to aspects of the present disclosure.

Additional cost may be associated with implementation of multi-region SRAM arrays of the present disclosure. For example, different work function material layer boundaries in different regions may require different photolithography mask designs. Similarly, different metal gate cut feature widths in different regions may also require different photolithography mask designs. Photolithography masks based on these photolithography mask designs may then be caused to be manufactured by a mask shop or mask fabricator. Thereafter, the photolithography masks are then used to fabricate SRAM devices. It is therefore beneficial to assess whether it is cost effective to implement multi-region SRAM arrays. Reference is now made to FIG. 11, which illustrates a method 1100. The method 1100 includes a block 1102 where a voltage drop along a bit line of an SRAM array. To determine the voltage drop along the bit line, a cross-sectional area and conductive material of the bit line may be determined based on the memory design layout and design rules. A computerized simulation may be performed based on the cross-sectional area, process variance, properties of the conductive material to determine the voltage drop from a region near a bias source to a region away from the bias source. The method 1100 includes a block 1104 where the voltage drop is compared to a critical voltage drop value. If the voltage drop is insignificant or may be addressed with other read/write assist features or logics shown in block 1108, multi-region SRAM arrays of the present disclosure may not be needed. It has been observed that when the voltage drop determined at block 1102 is greater than a critical voltage drop value of between 100 mV and about 200 mV, it is economically beneficial to implement the multi-region SRAM arrays of the present disclosure, as illustrated in block 1106.

Embodiments of the present disclosure provide many benefits. For example, the present disclosure provides a multi-region SRAM array to accommodate IR drop along lengths of bit lines, which IR drop may lead to failed bits. Each region of the multi-region SRAM array may include SRAM cells with different alpha ratios and beta ratios. The present disclosure also discloses varying widths of metal gate cut features and moving n-type/p-type work function layer boundaries to implement such different alpha ratios and beta ratios without additional photolithography steps or cost associated with extra photolithography masks. Embodiments of the present disclosure therefore improve the operation of an SRAM array without additional cost.

The present disclosure provides for many different embodiments. In one embodiment, a semiconductor device is provided. The semiconductor device includes a bias source, a memory cell array including a first region adjacent to the bias source and a second region away from the bias source, and a conductive line electrically coupled to the bias source, a first memory cell in the first region and a second memory cell in the second region. The first memory cell is characterized by a first alpha ratio and the second memory cell is characterized by a second alpha ratio smaller than the first alpha ratio.

In some implementations, the first memory cell includes a first n-type field effect transistor (NFET) and a first p-type field effect transistor (PFET) adjacent to the first NFET and the second memory cell includes a second NFET and a second PFET adjacent to the second NFET. The first NFET includes a first titanium nitride work function layer, the first titanium nitride work function layer terminating at a first end between the first NFET and the first PFET. The second NFET includes a second titanium nitride work function layer, the second titanium nitride work function layer terminating at a second end between the second NFET and the second PFET. A distance between the first end and the first NFET is greater than a distance between the second end and the second NFET. In some instances, the first PFET includes a first aluminum-containing work function layer over the first titanium nitride work function layer and wherein the second PFET includes an second aluminum-containing work function layer over the second titanium nitride work function layer. In some implementations, the first NFET and the second NFET are pull-down transistors and the first PFET and the second PFET are pull-up transistors. In some instances, a distance between the first NFET and the first PFET is substantially equal to a distance between the second NFET and the second PFET. In some implementations, a threshold voltage of the first NFET is greater than a threshold voltage of the second NFET. In some instances, the first memory cell includes a first n-type field effect transistor (NFET) and a first p-type field effect transistor (PFET) spaced apart from the first NFET by a first gate cut dielectric feature and the second memory cell includes a second NFET and a second PFET spaced apart from the second NFET by a second gate cut dielectric feature. The first gate cut dielectric feature includes a first width and the second gate cut dielectric feature includes a second width smaller than the first width. In some implementations, the first memory cell is characterized by a first beta ratio and the second memory cell is characterized by a second beta ratio substantially identical to the first beta ratio.

In another embodiment, a semiconductor device is provided. The semiconductor device includes a bias source and a memory cell array including a first region, a second region, and a third region. The first region is adjacent to the bias source, the third region away from the bias source, and the second region is disposed between the first region and the second region. A first n-type field effect transistor (NFET) in the first region includes a first threshold voltage, a second NFET in the second region includes a second threshold voltage, and a third NFET in the third region includes a third threshold voltage. The first threshold voltage is greater than the second threshold voltage and the second threshold voltage is greater than the third threshold voltage.

In some implementations, the first NFET includes a first active region extending along a first direction and a first titanium nitride layer over the first active region; the second NFET includes a second active region extending along the first direction and a second titanium nitride layer over the second active region; and the third NFET includes a third active region extending along the first direction and a third titanium nitride layer over the third active region. The first titanium nitride layer includes a first edge spaced from the first active region by a first distance. The second titanium nitride layer includes a second edge spaced from the second active region by a second distance. The third titanium nitride layer includes a third edge spaced from the third active region by a third distance. The first distance is smaller than the second distance and the second distance is smaller than the third distance. In some instances, the first NFET further includes a first titanium aluminum layer disposed over the first titanium nitride layer and the first edge, the second NFET further includes a second titanium aluminum layer disposed over the second titanium nitride layer and the second edge, and the third NFET further includes a third titanium aluminum layer disposed over the third titanium nitride layer and the third edge. In some implementations, each of the first NFET, the second NFET and the third NFET is a pull-down transistor. In some instances, the first region includes a first p-type field effect transistor (PFET) spaced apart from the first NFET by a first gate cut dielectric feature, the second region includes a second PFET spaced apart from the second NFET by a second gate cut dielectric feature, and the third region includes a third PFET spaced apart from the third NFET by a third gate cut dielectric feature. The first gate cut dielectric feature includes a first width. The second gate cut dielectric feature includes a second width smaller than the first width. The third gate cut dielectric feature includes a third width smaller than the second width. In some instances, each of the first PFET, the second PFET and the third PFET is a pull-up transistor.

In still another embodiment, a method is provided. The method includes receiving a memory device design including a bias source, a memory cell array including a first region adjacent to the bias source and a second region away from the bias source, and a conductive line electrically coupled to the bias source, a first memory cell in the first region and a second memory cell in the second region. The method further includes determining a voltage drop along the conductive line between the first memory cell and the second memory cell and comparing the voltage drop to a critical voltage drop value, and when the voltage drop is greater than the critical voltage drop value, lowering an alpha ratio of the second memory cell such that the alpha ratio of the second memory cell is smaller than an alpha ratio of the first memory cell.

In some implementations, the critical voltage drop value is between about 100 mV and about 200 mV. In some instances, the lowering of the alpha ratio of the second memory cell includes adopting, for the first memory cell, a first horizontal distance between a first n-type active region and a boundary between a first aluminum-free work function metal layer over the first n-type active region and a first aluminum-containing work function metal layer over an adjacent first p-type active region, wherein the first aluminum-free work function metal layer is not formed over the adjacent first p-type active region, and adopting, for the second memory cell, a second horizontal distance between a second n-type active region and a boundary between a second aluminum-free work function metal layer over the second n-type active region and a second aluminum-containing work function metal layer over an adjacent second p-type active region, wherein the second aluminum-free work function metal layer is not formed over the adjacent second p-type active region. The first horizontal distance is greater than the second horizontal distance. In some instances, the method may further include creating a first photolithography mask design for forming the first aluminum-free work function metal layer and the second aluminum-free work function metal layer, causing a first photolithography mask to be made according to the first photolithography mask design, and forming a memory device using the first photolithography mask. In some implementations, the lowering of the alpha ratio of the second memory cell includes adopting a first metal gate cut feature to divide a first metal gate stack in the first memory cell into two segments, and adopting a second metal gate cut feature to divide a second metal gate stack in the second memory cell into two segments. A width the first metal gate cut feature is greater than a width the second metal gate cut feature. In some instances, the method may further include creating a second photolithography mask design for forming the first metal gate cut feature and the second metal gate cut feature, causing a second photolithography mask to be made according to the second photolithography mask design, and forming a memory device using the second photolithography mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a bias source;
   a memory cell array comprising a first region adjacent to the bias source and a second region away from the bias source; and
   a conductive line electrically coupled to the bias source, a first memory cell in the first region and a second memory cell in the second region,
   wherein the first memory cell is characterized by a first alpha ratio and the second memory cell is characterized by a second alpha ratio smaller than the first alpha ratio,
   wherein each of the first memory cell and the second memory cell is disposed over an n-type well and two p-type wells sandwiching the n-type well.

2. The semiconductor device of claim 1,
   wherein the first memory cell comprises a first n-type field effect transistor (NFET) and a first p-type field effect transistor (PFET) adjacent to the first NFET,
   wherein the second memory cell comprises a second NFET and a second PFET adjacent to the second NFET,
   wherein the first NFET includes a first titanium nitride work function layer, the first titanium nitride work function layer terminating at a first end between the first NFET and the first PFET,
   wherein the second NFET includes a second titanium nitride work function layer, the second titanium nitride work function layer terminating at a second end between the second NFET and the second PFET,
   wherein a distance between the first end and the first NFET is greater than a distance between the second end and the second NFET.

3. The semiconductor device of claim 2,
   wherein the first PFET includes a first aluminum-containing work function layer over the first titanium nitride work function layer,
   wherein the second PFET includes an second aluminum-containing work function layer over the second titanium nitride work function layer.

4. The semiconductor device of claim 2,
   wherein the first NFET and the second NFET are pull-down transistors,
   wherein the first PFET and the second PFET are pull-up transistors.

5. The semiconductor device of claim 2,
   wherein a distance between the first NFET and the first PFET is substantially equal to a distance between the second NFET and the second PFET.

6. The semiconductor device of claim 2, wherein a threshold voltage of the first NFET is greater than a threshold voltage of the second NFET.

7. The semiconductor device of claim 1,
   wherein the first memory cell comprises a first n-type field effect transistor (NFET) and a first p-type field effect transistor (PFET) spaced apart from the first NFET by a first gate cut dielectric feature,
   wherein the second memory cell comprises a second NFET and a second PFET spaced apart from the second NFET by a second gate cut dielectric feature,
   wherein the first gate cut dielectric feature comprises a first width,
   wherein the second gate cut dielectric feature comprises a second width smaller than the first width.

8. The semiconductor device of claim 1,
wherein the first memory cell is characterized by a first beta ratio and the second memory cell is characterized by a second beta ratio substantially identical to the first beta ratio.

9. A semiconductor device, comprising:
a bias source; and
a memory cell array comprising a first region, a second region, and a third region,
wherein the first region is adjacent to the bias source, the third region away from the bias source, and the second region is disposed between the first region and the second region,
wherein a first n-type field effect transistor (NFET) in the first region includes a first threshold voltage, a second NFET in the second region includes a second threshold voltage, and a third NFET in the third region includes a third threshold voltage,
wherein the first threshold voltage is greater than the second threshold voltage and the second threshold voltage is greater than the third threshold voltage.

10. The semiconductor device of claim 9,
wherein the first NFET includes a first active region extending along a first direction and a first titanium nitride layer over the first active region,
wherein the second NFET includes a second active region extending along the first direction and a second titanium nitride layer over the second active region,
wherein the third NFET includes a third active region extending along the first direction and a third titanium nitride layer over the third active region,
wherein the first titanium nitride layer includes a first edge spaced from the first active region by a first distance,
wherein the second titanium nitride layer includes a second edge spaced from the second active region by a second distance,
wherein the third titanium nitride layer includes a third edge spaced from the third active region by a third distance,
wherein the first distance is smaller than the second distance and the second distance is smaller than the third distance.

11. The semiconductor device of claim 10,
wherein the first NFET further includes a first titanium aluminum layer disposed over the first titanium nitride layer and the first edge,
wherein the second NFET further includes a second titanium aluminum layer disposed over the second titanium nitride layer and the second edge,
wherein the third NFET further includes a third titanium aluminum layer disposed over the third titanium nitride layer and the third edge.

12. The semiconductor device of claim 9, wherein each of the first NFET, the second NFET and the third NFET is a pull-down transistor.

13. The semiconductor device of claim 9,
wherein the first region comprises a first p-type field effect transistor (PFET) spaced apart from the first NFET by a first gate cut dielectric feature,
wherein the second region comprises a second PFET spaced apart from the second NFET by a second gate cut dielectric feature,
wherein the third region comprises a third PFET spaced apart from the third NFET by a third gate cut dielectric feature,
wherein the first gate cut dielectric feature comprises a first width,
wherein the second gate cut dielectric feature comprises a second width smaller than the first width,
wherein the third gate cut dielectric feature comprises a third width smaller than the second width.

14. The semiconductor device of claim 13, wherein each of the first PFET, the second PFET and the third PFET is a pull-up transistor.

15. A method, comprising:
receiving a memory device design comprising:
a bias source,
a memory cell array comprising a first region adjacent to the bias source and a second region away from the bias source, and
a conductive line electrically coupled to the bias source, a first memory cell in the first region and a second memory cell in the second region;
determining a voltage drop along the conductive line between the first memory cell and the second memory cell;
comparing the voltage drop to a critical voltage drop value; and
when the voltage drop is greater than the critical voltage drop value, lowering an alpha ratio of the second memory cell such that the alpha ratio of the second memory cell is smaller than an alpha ratio of the first memory cell.

16. The method of claim 15, wherein the critical voltage drop value is between about 100 mV and about 200 mV.

17. The method of claim 15, wherein the lowering of the alpha ratio of the second memory cell comprises:
adopting, for the first memory cell, a first horizontal distance between a first n-type active region and a boundary between a first aluminum-free work function metal layer over the first n-type active region and a first aluminum-containing work function metal layer over an adjacent first p-type active region, wherein the first aluminum-free work function metal layer is not formed over the adjacent first p-type active region; and
adopting, for the second memory cell, a second horizontal distance between a second n-type active region and a boundary between a second aluminum-free work function metal layer over the second n-type active region and a second aluminum-containing work function metal layer over an adjacent second p-type active region, wherein the second aluminum-free work function metal layer is not formed over the adjacent second p-type active region,
wherein the first horizontal distance is greater than the second horizontal distance.

18. The method of claim 17, further comprising:
creating a first photolithography mask design for forming the first aluminum-free work function metal layer and the second aluminum-free work function metal layer;
causing a first photolithography mask to be made according to the first photolithography mask design; and
forming a memory device using the first photolithography mask.

19. The method of claim 15, wherein the lowering of the alpha ratio of the second memory cell comprises:
adopting a first metal gate cut feature to divide a first metal gate stack in the first memory cell into two segments; and
adopting a second metal gate cut feature to divide a second metal gate stack in the second memory cell into two segments
wherein a width the first metal gate cut feature is greater than a width the second metal gate cut feature.

20. The method of claim 19, further comprising:
creating a second photolithography mask design for forming the first metal gate cut feature and the second metal gate cut feature;
causing a second photolithography mask to be made according to the second photolithography mask design; and
forming a memory device using the second photolithography mask.

* * * * *